United States Patent [19]

Kay et al.

[11] Patent Number: 4,959,558
[45] Date of Patent: Sep. 25, 1990

[54] CIRCUIT ARRANGEMENT FOR DETECTING CROSS-OVER BY AN ALTERNATING VOLTAGE OF A FIXED REFERENCE VOLTAGE LEVEL

[75] Inventors: Malcolm J. Kay, Lockleys; Philip A. Tracy, Epping, both of Australia

[73] Assignee: U.S. Philips Corporation, New York, N.Y.

[21] Appl. No.: 326,575

[22] Filed: Mar. 21, 1989

[30] Foreign Application Priority Data

Mar. 31, 1988 [AU] Australia .............................. PI7555

[51] Int. Cl.$^5$ ...................... H03K 5/153; H03K 5/24; H03K 17/13
[52] U.S. Cl. ................................. 307/354; 307/358; 307/362; 307/632
[58] Field of Search ............... 307/354, 360, 362, 358, 307/632, 647

[56] References Cited

U.S. PATENT DOCUMENTS

3,955,102  5/1976  Chi ........................................ 307/354
4,291,543  9/1981  Alluto .................................... 307/354
4,292,552  9/1981  Tanaka ................................... 307/360

Primary Examiner—John Zazworsky
Attorney, Agent, or Firm—Bernard Franzblau

[57] ABSTRACT

A circuit for detecting the crossings by an applied alternating voltage of two separate voltage threshold levels above and below a fixed reference voltage level. The circuit includes the series combination of two resistances (1 and 2) in an electrical path between the applied alternating voltage and a dc reference voltage. Two voltage comparators each having two logic output states compare the voltage at the junction (P) of the two resistances with the reference voltage so that the logic output state of the comparators at any instant is determined by the voltage at the junction relative to the reference voltage. A logic gate combines the logic output states of the comparators to produce a pulse spanning each instant of cross-over by the alternating voltage of the reference voltage. The pulse has a leading edge and a trailing edge which respectively correspond with the instants of crossing by the alternating voltage of the two separate threshold levels. One threshold level is determined by the magnitude of the reference voltage and the other by the ratio of the resistance values of the two resistances and the dc supply voltage. A circuit adapted for use in an replaces one resistor by a non-linear network.

13 Claims, 6 Drawing Sheets

CIRCUIT ARRANGEMENT FOR DETECTING CROSS-OVER BY AN ALTERNATING VOLTAGE OF A FIXED REFERENCE VOLTAGE LEVEL

The present invention relates to circuit arrangements for detecting the crossings by an applied alternating voltage of two separate voltage threshold levels respectively above and below a fixed reference voltage level (for example, zero volts).

Circuit arrangements of the kind to which the invention relates are known and have different forms and applications including, for example, so-called "zero-crossing detector circuits". An article in the publication "Mullard Technical Publication No. 132" of October 1976 entitled "Zero-crossing detector circuits" provides details of and other information in relation to "zero-crossing detector circuits".

So-called "Zero-crossing detector circuits" are commonly used in power control systems incorporating a solid state switching device such as a triac and operating from an alternating mains voltage supply. By utilizing a zero-crossing detector for detecting the zero crossing points of the alternating mains voltage supply, gating pulses for triggering the solid state switching device can be generated which are timed relative to the alternating mains voltage waveform.

When utilizing a zero-crossing detector with such a power control system, in order to maintain conduction in the solid state device and to simultaneously minimize power consumption in the control system, there must be precise determination of the commencement and termination of the gating pulses relative to the instantaneous value of the applied AC voltage. For maintaining conduction in the solid state device, it is necessary for a gating pulse to be applied towards the end of each half-cycle of the AC voltage before the device current has dropped to the "holding current level" and to continue into the next half-cycle until the device current (in the opposite direction) has reached the "latching current level". On the other hand, it is desirable to minimize the gate pulse duration in order to conserve power in the control system, particularly when the gate pulse energy is obtained via a dropping resistance from the AC supply. Precise determination of the commencement and termination of gating pulses can be achieved with known "zero-crossing" circuit arrangements by employing transistors having characteristics which are matched to very close tolerances. In a circuit arrangement in accordance with the present invention, such precise determination is achievable employing simple and relatively inaccurate components. Other advantages of a circuit arrangement in accordance with the invention will be evident from the following description.

SUMMARY OF THE INVENTION

A circuit arrangement in accordance with the invention for detecting the crossings by an applied alternating voltage of two separate threshold levels respectively above and below a fixed reference voltage level comprises
a direct current source supplying a dc supply voltage of fixed magnitude relative to the reference voltage, an electrical path extending between the applied alternating voltage and the dc supply voltage which includes the series combination of two resistances, a first voltage comparator having two possible logic output states and connected to compare the voltage at the junction of the two resistances with the dc supply voltage so that the logic output state of the first voltage comparator at any instant is determined by the voltage at the junction relative to the dc supply voltage, a second voltage comparator having two possible logic output states and connected to compare the voltage at the junction of the two resistances with the reference voltage so that the logic output state of the second voltage comparator at any instant is determined by the voltage at the junction relative to the reference voltage, and logic means in which the logic output state of the first comparator is combined logically with the logic output state of the second comparator whereby a pulse spanning each instant of cross-over by the applied alternating voltage of the fixed reference voltage is produced which have a leading edge and a trailing edge that respectively correspond with the instants of crossing by the applied alternating voltage of the two separate threshold levels. As a result, one threshold level is determined by the magnitude of the dc voltage and the other threshold level is determined by the ratio of the resistance values of the two resistances and the dc supply voltage.

The fixed reference voltage may be zero voltage.

The two resistances may be so proportioned with respect to each other that the mid-point of each said pulse spanning each instant of cross over substantially coincides with the said instant of cross over by the applied alternating voltage of the fixed reference voltage.

In one form of the invention, the first voltage comparator is formed by a first transistor, the base/emitter path of which is connected between the d.c. supply voltage and one end of the series combination thereby forming a part of the electrical path and the second voltage comparator is formed by a second transistor of opposite conductivity type to the first transistor, the base/emitter path of which is connected via an isolation means between the reference voltage and the junction of the two resistances.

It is advantageous for the d.c. supply voltage to be derived by rectification of the voltage at the junction of the two resistances.

In the electrical path extending between the applied alternating voltage and the dc supply voltage which includes the series combination of two resistances, both of these resistances have a fixed resistance value. However, when utilizing integrated circuit techniques, it is a common practice to employ a network of circuit elements in lieu of a fixed resistance. Typically, such a network may exhibit a non-linear voltage versus current characteristic which may be used to advantage. In accordance with a further aspect of the present invention, one of the said resistances of the series combination has a non-linear voltage versus current characteristic and may be composed of a network of circuit elements.

BRIEF DESCRIPTION OF THE DRAWINGS

The invention will now be described with reference to the accompanying drawings, in which.

DESCRIPTION OF THE PREFERRED EMBODIMENTS

Figure 1:
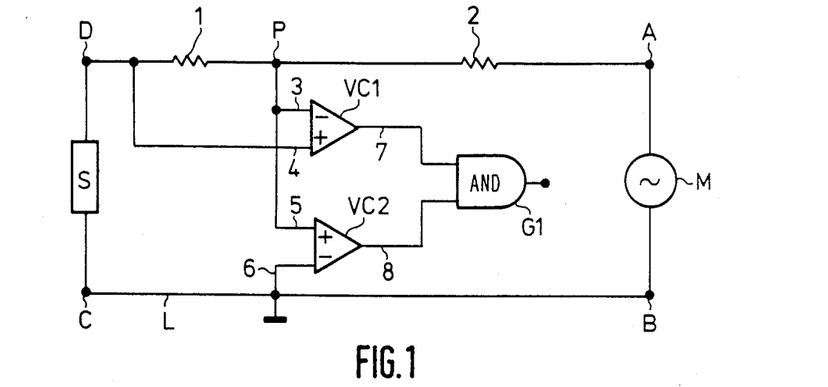
FIG. 1 is a block schematic diagram of a circuit arrangement according to the invention.

In FIG. 1, a supply line L extends between terminals B and C and is maintained at a fixed reference level of zero volts. An alternating mains voltage source, denoted by the letter M, is connected between the terminal A and the terminal B, whereas a direct current supply source denoted by the letter S is connected between the terminals D and C and maintains the terminal D at +40 volts with respect to the terminal C. A resistance 1 is connected in series with a resistance 2 between the terminals A and D. The resistances 1 and 2 are of equal resistance value and the junction of the resistances 1 and 2 is denoted by the letter P. A voltage comparator VC1 is connected to compare the voltage at the point P with the voltage at the terminal D. For this purpose, the negative (inverting) input 3 of the comparator VC1 is connected to the point P and the positive (non-inverting) input 4 of the comparator VC1 is connected to the terminal D. In addition, a voltage comparator VC2 is connected to compare the voltage at the point P with the voltage of the supply line L and for this purpose the positive input 5 of the comparator VC2 is connected to the point P and the negative input 6 of the comparator VC2 is connected to the supply line L, which is maintained at zero volts as previously stated. The output 7 of the voltage comparator VC1 and the output 8 of the voltage comparator VC2 are connected to respective inputs of an "AND" gate G1.

Ideally, operation of the schematic circuit arrangement of FIG. 1 is such that the output 7 of the voltage comparator VC1 is "low" when the voltage at the input 3 is positive relative to the voltage at the input 4 but becomes "high" when the voltage at the input 3 is negative relative to the voltage at the input 4, whereas the output 8 of the voltage comparator VC2 is "low" when the voltage at the input 5 is negative relative to the voltage at the input 6 and is "high" when the voltage at the input 5 is positive relative to the voltage at the input 6.

Figures 2A, 2B:
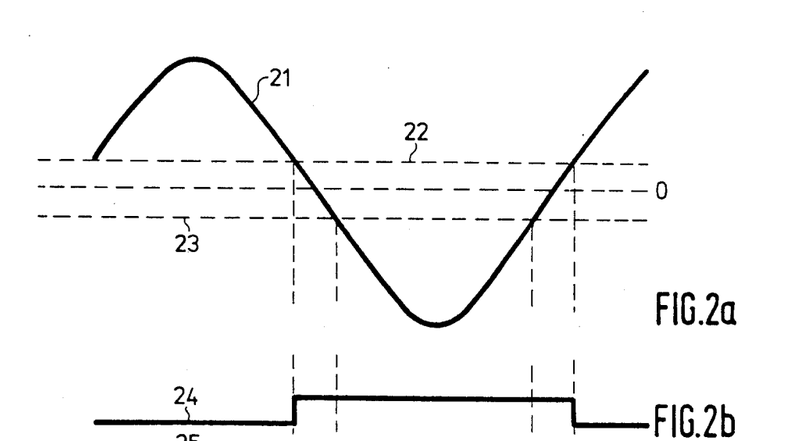
FIGS. 2a–2d show waveforms related to the operation of the circuit arrangement of FIG. 1.

Operation of the circuit of FIG. 1 will be understood from the waveforms shown in FIGS. 2(a), 2(b), 2(c) and 2(d). In FIG. 2(a), the mains alternating voltage present at the terminal A relative to the terminal B and the line L is denoted by the waveform 21, the voltage of the line L (i.e. zero voltage) being denoted by the dotted line 0, the voltage of the terminal D relative to zero (i.e. +40 volts) being denoted by the dotted line 22. A voltage level of equal magnitude but of opposite polarity to that present at the terminal D (i.e. −40 volts) is denoted by the dotted line 23.

Figures 2C, 2D:
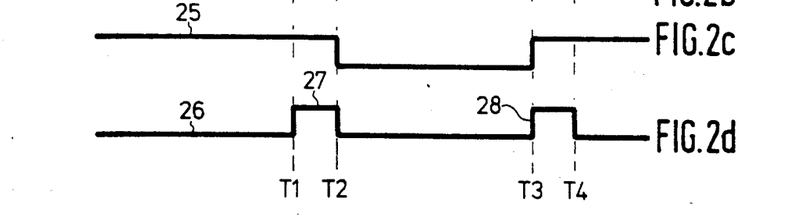

In FIG. 2(b), the output voltage of the voltage comparator VC1 is represented by the waveform 24. In FIG. 2(c), the output voltage of the voltage comparator VC2 is represented by the waveform 25. In FIG. 2(d), the output of the gate G1 is denoted by the waveform 26.

A study of the waveforms of FIG. 2 shows that during positive half-cycles of the mains alternating voltage, the output of the voltage comparator VC1 is "low" provided the voltage of the waveform 21 is greater than 40 volts, i.e. above the dotted line 22. At the instant T1 when the voltage of the waveform 21 falls below the dotted line 22, the output of the comparator VC1 goes "high" and remains "high" until the instant T4 when the voltage of waveform 21 again exceeds +40 volts, as denoted by the dotted line 22. In this respect, for different voltages present at the terminal A, Table 1 below sets out the voltage difference between the terminal A and the terminal D, the voltages developed respectively across the resistances 1 and 2 and the voltage present at the Point P.

TABLE 1

| VOLTAGE AT TERMINAL A | VOLTAGE AT TERMINAL D | VOLTAGE DIFFERENCE BETWEEN TERMINALS A AND D | VOLTAGE ACROSS RESISTANCE 1 | VOLTAGE ACROSS RESISTANCE 2 | VOLTAGE AT POINT P |
|---|---|---|---|---|---|
| +200 | +40 | 160 | 80 | 80 | +120 |
| +100 | +40 | 60 | 30 | 30 | +70 |
| +40 | +40 | 0 | 0 | 0 | +40 |
| −40 | +40 | 80 | 40 | 40 | 0 |
| −100 | +40 | 140 | 70 | 70 | −30 |
| −200 | +40 | 240 | 120 | 120 | −80 |

As indicated in Table 1, at the instant T1 when the magnitude of the voltage wave 21 is +40 volts then, since the voltage at the terminal D is also +40 volts, the voltage at the point P is likewise +40 volts so that immediately subsequent to the instant T1, as the magnitude of the voltage wave 21 falls below +40 volts, the voltage at the input 3 of the voltage comparator VC1 becomes less than +40 volts causing a transition at the output 7 from "low" to "high". Since the magnitude of the voltage waveform 21 remains less than +40 volts between the instant T1 and the instant T4, the output 7 remains "high" until the instant T4, after which the magnitude of the voltage waveform 21 is again greater than +40 volts causing the voltage at point P to exceed the voltage present at the terminal D causing a transition at the output 7 of the comparator VC1 from "high" to "low".

Also, as indicated by Table 1, at the instant T2 when the magnitude of the voltage wave 21 is −40 volts then, since the voltage at the terminal D is +40 volts, the voltage at point P is zero volts. Accordingly, prior to the instant T2, the input 5 of the voltage comparator VC2 is positive relative to the voltage of input 6 so that the output 8 is "high", whereas subsequent to the instant T2 the input 5 becomes negative relative to the voltage of the input 6 so that there is transition of the voltage at the output 8 from "high" to "low". Since the magnitude of the voltage waveform 21 is negative relative to −40 volts between the instants T2 and T3, the output 8 remains "low" until the instant T3, after which the magnitude of the waveform 21 is such that the voltage at the point P, and accordingly also the voltage at the input 5, is positive relative to the voltage of the input 6 (zero volts) causing a transition at the output 8 from "low" to "high".

Between the instants T1 and T2 and also between the instants T3 and T4, the output 7 of the voltage comparator VC1 is "high" and the output 8 of the voltage comparator VC2 is also "high" with the result that positive-going pulses 27 and 28 are generated at the output of the "AND" gate G1 between the instants T1 and T2 and between the instants T3 and T4. Since the resistances 1 and 2 are of equal resistance value, the pulses 27 and 28 are symmetrical about the instant at which the wave 21 crosses the fixed reference level 0 corresponding to zero volts.

Figure 3:
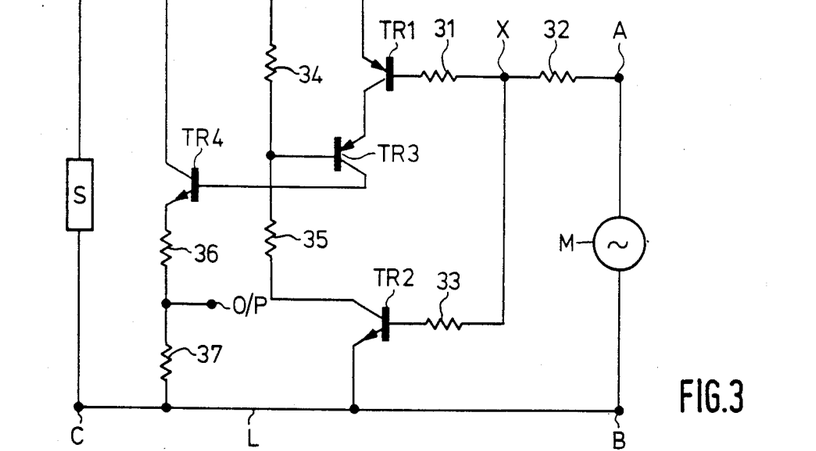
FIG. 3 is a schematic diagram of another circuit arrangement according to the invention.

In FIG. 3, identical parts to those of FIG. 1 are denoted by like letters or numerals. Again, a supply line L extending between terminal B and C is maintained at a fixed reference level of zero volts and an alternating mains voltage source M is connected between the terminals A and B and in this case supplies an alternating voltage of approximately 70 volts peak-to-peak between those terminals. A direct current source S is connected between the terminals D and C which, in this case, is a 10 volts source and maintains the terminal D at +10 volts with respect to the terminal C.

The series combination of two resistances is constituted by resistances 31 and 32 which are of equal resistance value. The first voltage comparator is constituted by a transistor TR1 and its associated circuitry and the second voltage comparator is constituted by a transistor TR2 and its associated circuitry. A transistor TR3 functions as an "AND" gate and a transistor TR4 functions as a current amplifier for the output of the transistor TR3.

The terminal D is connected via the emitter-base path of the transistor TR1 to one end of the resistance 31 so that a conductive path extends between the terminal A and the terminal D when the emitter-base path of the transistor TR1 is conducting. The emitter-base path of the transistor TR1 is conductive only when the voltage at point X (i.e. the junction of the equal resistances 31 and 32) is negative with respect to a voltage equal to that of the supply voltage S less the base-emitter voltage of the transistor TR1 (i.e. +10 volts - Vbe$_{tr1}$ = 9.4 volts approx.).

The point X is also connected via a resistance 33 and the base-emitter path of the transistor TR2 to the supply line L which is at zero potential. Accordingly, the base-emitter path of the transistor TR2 is conductive only when the voltage at the point X is positive with respect to a voltage equal to the base-emitter voltage of the transistor TR2 (i.e. Vbe$_{tr2}$ = 0.6 volts approx.). Of course, when the emitter-base path of the transistor TR1 and/or the base-emitter path of the transistor TR2 are conductive, the potential at the point X at any instant is determined by the relative values of two or more of the resistances 31, 32 and 33.

The collector electrode of the transistor TR1 is connected to the emitter electrode of the transistor TR3, the base of which is connected to the junction of resistances 34 and 35 and the collector of which is connected to the base of the transistor TR4. The resistances 34 and 35 are serially connected between the positive terminal D of the DC supply source S and the collector electrode of the transistor TR2. Consequently, the voltage at the junction of the resistances 34 and 35, and also at the base electrode of the transistor TR3, is determined by the state of conductivity of the transistor TR2, the resistances 34 and 35 being proportioned so that the gate formed by the transistor TR3 is enabled only when the collector-emitter path of the transistor TR2 is conducting.

The collector of the transistor TR4 is connected directly to the terminal D, and the emitter of the transistor TR4 is connected via the serially connected resistances 36 and 37 to the supply line L. An output terminal O/P is provided at the junction of the resistances 36 and 37.

Accordingly, an output pulse is produced at the output terminal O/P when the transistor TR4 is "ON". However, the transistor TR4 can only be "ON" when transistor TR3 is "ON" and the transistor TR3 can only be in the "ON" state when both of the transistors TR1 and TR2 are "ON".

Figure 4A:
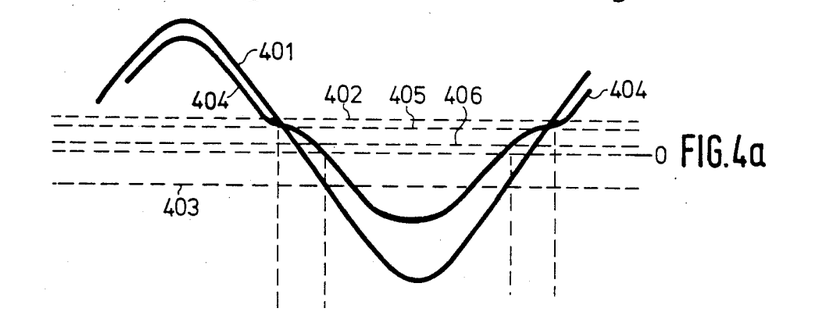
FIGS. 4a–4d show waveforms related to the operation of the circuit arrangement of FIG. 3.

FIG. 4 will assist in describing the operation of the schematic circuit arrangement of FIG. 3. In FIG. 4(a), approximately one full cycle of the alternating voltage present at the terminal A relative to the supply line L is represented by the voltage waveform 401 and the fixed reference level of zero volts (i.e. the voltage of the supply line L) is represented by the dotted line 0. The magnitude of the voltage present across the direct current supply source S, and accordingly of the voltage of the terminal D with respect to the supply line L (i.e. +10 volts), is represented by the dotted line 402, whereas an equal voltage of opposite polarity (i.e. −10 volts) is represented by the dotted line 403. The voltage present at the point X at any instant is represented by the voltage waveform 404. The voltage level of the point X at which the transistor TR1 switches from an "ON" state to an "OFF" state or vice-versa is represented by the dotted line 405 and the voltage level of point X at which the transistor TR2 switches from the "ON" state to the "OFF" state or vice-versa is represented by the dotted line 406.

Figures 4B, 4C:
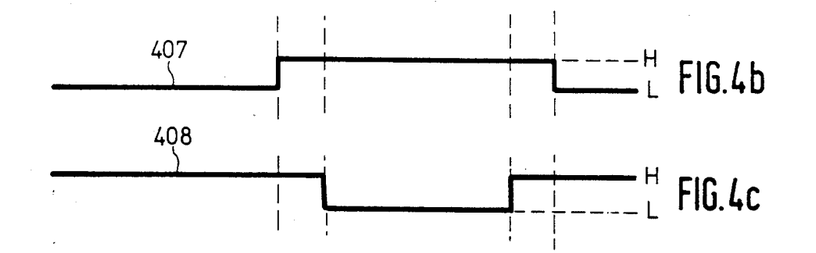

In FIG. 4(b) the emitter collector current level of the transistor TR1 is represented by the waveform 407 and, in FIG. 4(c), the emitter-collector current level of the transistor TR2 is represented by the waveform 408. In both figures the current level at which the transistor concerned is "ON" is denoted by the letter H and the current level at which the transistor is "OFF" is denoted by the letter L.

Figure 4D:
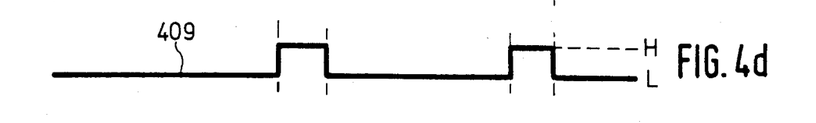

In FIG. 4(d) the voltage at the output terminal O/P in the emitter circuit of the transistor TR4 is represented by the wave 409 and again the letters H and L denote the levels at which the transistor TR4 is either "ON" or "OFF".

Appropriate values for the components of FIG. 3 are listed in TABLE 2 below:

TABLE 2

| | |
|---|---|
| Resistance 31 | 200 kilohms |
| Resistance 32 | 200 kilohms |
| Resistance 33 | 2 megohms |
| Resistance 34 | 50 kilohms |
| Resistance 35 | 200 kilohms |
| Resistance 36 | 100 ohms |
| Resistance 37 | 1000 ohms |
| Transistor TR1 | Type BC557 |

TABLE 2-continued

| Transistor TR2 | Type BC547 |
|---|---|

The resistance 33 functions as an isolation resistance, isolating the point X from the line L during the time that the base-emitter path of the transistor TR2 is conductive. Accordingly, the selected value of the resistance 33 should be several times greater than the value of the resistance 32.

Figure 5:
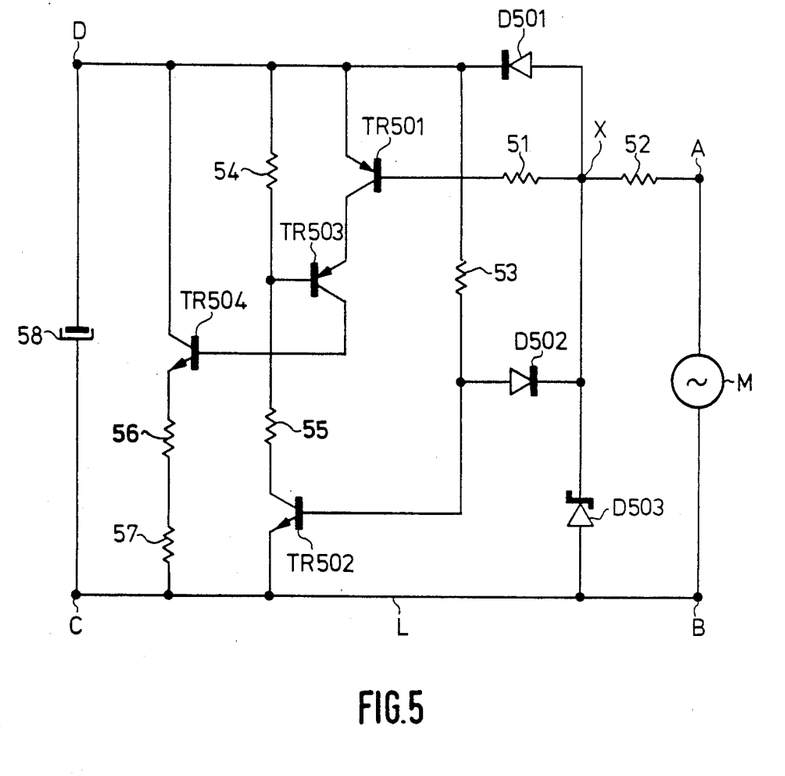
FIG. 5 is a circuit diagram of a further circuit arrangement in accordance with the invention.

The circuit arrangement of FIG. 5 is a practical version of the circuit arrangement of FIG. 3 in which the applied alternating voltage is a mains alternating voltage of approximately 240 volts R.M.S. supplied across the terminals A and B from the source M and in which the direct current source S is eliminated and, in lieu thereof, the said DC supply voltage is derived by rectification of the voltage at the junction of the two resistances.

In the circuit of FIG. 5, transistors TR501, TR502, TR503 and TR504 together with associated resistances 54, 55, 56 and 57 respectively correspond, in general, with the transistors TR1, TR2, TR3 and TR4 and associated resistances 34, 35, 36 and 37 of FIG. 3 and have generally similar characteristics, values and operation. However, there are several differences between the circuit arrangement of FIG. 5 and that of FIG. 3. In accordance with the invention, an electrical path extends between terminal A and terminal D via the base-emitter path of the transistor TR501, which includes the series combination of resistances 51 and 52. The junction of these resistances is again denoted by the letter X. However, in this case, the junction X is connected to the line L via a zener diode D503 and is also connected via a rectifier diode D501 to the terminal D, a storage capacitance 58 being connected between the terminals D and C. Also, in this case, the base electrode of the transistor TR502 is connected to the junction X via a switching diode D502 and to the dc voltage supply via a resistance 53. It is to be noted that the series combination of the resistance 53 and the switching diode D502 is in shunt with the series combination of the emitter-base path of the transistor TR501 and the resistance 51. The resistance values of the resistance 51 and of the resistance 53 are chosen to be equal to each other and to have twice the resistance value of the resistance 52 so that each time that the emitter-base path of the transistor TR501 is conductive and the switching diode D502 is simultaneously conductive, then the resistances 51 and 53 are conducting in parallel with each other and thus are equivalent to a single resistance extending between the junction X and the terminal D equal in value to the resistance 52.

Figure 6A:
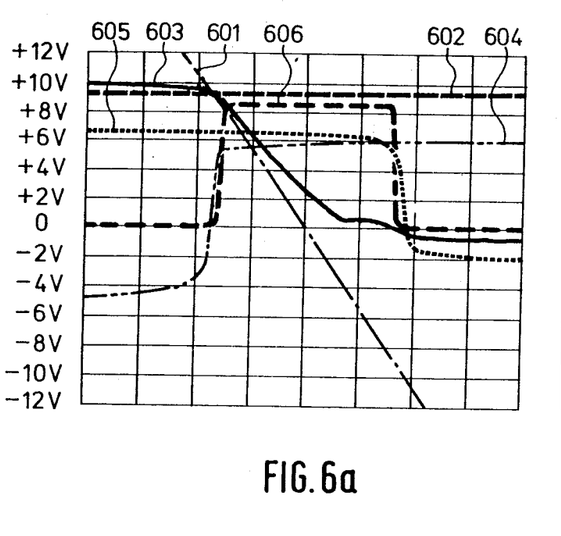
FIGS. 6a and 6b show waveforms related to the operation of the circuit arrangement of FIG. 5.
Figure 6B:
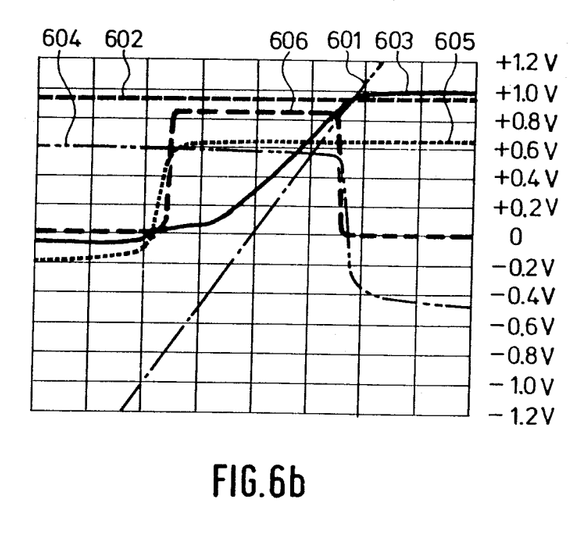

FIGS. 6a and 6b show waveforms which will assist in describing the operation of the circuit arrangement of FIG. 5. Owing to the large magnitude of the applied alternating voltage present across the terminals A and B (240 volts R.M.S.) compared with the magnitude of the dc voltage present across the terminals D and C (nominally 9.4 volts), the voltage waveforms present at relevant parts of the circuit arrangement of FIG. 5 are illustrated in part only in FIG. 6, i.e. between certain amplitude limits and between certain time limits for two separate time intervals corresponding to different parts of each cycle of the applied alternating voltage in proximity to the cross-over instants. FIG. 6A shows the waveforms during one time interval and FIG. 6B shows the waveforms during the remaining time interval. In both figures, the waveforms are illustrated in correct time relationship with each other. In both FIG. 6A and FIG. 6B, zero voltage level is denoted by the letter O, the applied alternating voltage between the terminals A and B is denoted by the numeral 601, the dc voltage present across the terminals D and C is shown as a dashed line and denoted by the numeral 602, the waveform of the derived voltage present at the junction X is denoted by the numeral 603, and the waveform of the voltage present between the base electrode and the emitter electrode of the transistor TR501 is drawn as a dash-dotted line denoted by the numeral 604. The waveform of the voltage present between the base electrode and the emitter electrode of the transistor TR502 is drawn as a dotted line denoted by the numeral 605 and the output voltage waveform produced at the junction of the resistances 56 and 57 is denoted by the numeral 606.

FIG. 6A shows the applied alternating voltage waveform 601 over a time period of relatively short duration in which the waveform 601 crosses the zero voltage level at the end of a positive half cycle and at the commencement of the subsequent negative half cycle of the applied alternating voltage, together with the other relevant voltage waveforms during the corresponding time period, whereas FIG. 6B shows the crossing of the zero voltage level by the applied voltage 601 in the reverse direction from a negative half-cycle to the subsequent positive half-cycle, together with the other relevant voltage waveforms during the corresponding time period.

The voltage scale provided at the left hand side of FIG. 6A is applicable to both FIGS. 6A and 6B in relation to the waveforms 601, 602, 603 and 606 only, whereas the voltage scale provided at the right hand side of FIG. 6B is applicable to both FIGS. 6A and 6B in relation to waveforms 604 and 605 only. From FIGS. 6A and 6B it can be seen that during each positive half-cycle of the applied alternating voltage 601, the voltage 603 at the junction X is limited by the action of the zener diode 503 to a voltage corresponding to the zener voltage of the diode D503 which is nominally 10 volts but, in fact, is approximately 9.9 volts. During the negative half-cycles of the applied alternating voltage, the voltage 603 at the junction X falls to a level negative with respect to zero by approximately 0.6 volts, which is the forward voltage drop across the zener diode D503. Accordingly, during each positive half-cycle of the applied alternating voltage, the storage capacitance 58 is charged via the rectifier diode D501 to a level corresponding with the zener voltage of the diode D503 less the forward voltage of the rectifier diode D501 as indicated by the voltage waveform 602, which is a substantially fixed voltage of approximately +9.3 volts.

During nearly the whole of each positive half-cycle of the applied alternating voltage (as represented by the wave 601) in which the voltage of the junction X (as represented by the wave 603) is positive with respect to the voltage at terminal D (as represented by the wave 602), the transistor TR501 is cut-off. However, towards the end of each positive half-cycle of the applied alternating voltage, as the voltage at the junction X continues to fall relative to the voltage at terminal D, a point is reached at which the transistor TR501 is turned on. This point is reached when the voltage at the junction X is approximately 8.7 volts, i.e. less than the voltage of the terminal D by an amount equal to approximately 0.6 volts (the forward voltage drop across the emitter base junction of the transistor TR501). The steep rise which occurs in the wave 604 in FIG. 6A corresponds with this point. From this point onward, the transistor TR501 continues to conduct for the remainder of each positive half-cycle of the applied alternating voltage, throughout the following negative half-cycle of the applied alternating voltage and into the subsequent positive half-cycle. Early in each positive half-cycle of the applied alternating voltage, the voltage at the junction X rises towards the same voltage level as that of the terminal D so that the transistor TR501 is cut-off again when the difference between the voltage of the junction X (as indicated by the wave 603) and the voltage of the terminal D is less than approximately 0.6 volts. This corresponds with the sharp fall in the magnitude of the wave 604 shown in FIG. 6B. The transistor TR501 remains cut-off until towards the end of the positive half-cycle of the applied alternating voltage 601 when the voltage at the junction X has fallen once more to the level at which the transistor TR501 is turned on again.

The transistor TR502 is turned on during a part of each positive half-cycle of the applied alternating voltage (as represented by the wave 601) in which the voltage of the junction X (as represented by the wave 603) is positive with respect to zero potential since the voltage of the base electrode of the transistor TR502 is positive with respect to the line L during that time.

Since the terminal D is 9.3 volts positive with respect to the line L, base-emitter current of the transistor TR502 flows via the resistance 53 maintaining the base voltage of the transistor TR502 at approximately 0.6 volts positive with respect to the line L, thus causing the switching diode D502 to be back-biassed and thus cut-off provided that the voltage at the junction X is positive relative to zero. On the other hand, when the voltage at the junction X falls below zero, the diode D502 conducts, and the voltage at the base electrode of the transistor TR502 falls below 0.6 volts cutting off the transistor TR502. As indicated in FIGS. 6A and 6B, during the whole of each positive half-cycle of the applied alternating voltage and also during the beginning portion and the end portion of each negative half-cycle of the applied alternating voltage, the voltage at the junction X is greater than zero so that the transistor TR502 is conducting under those conditions but is cut-off during the remaining time.

With the diode D502 cut-off but with the transistor TR501 conducting, the voltage at the junction X at any instant is determined by the magnitude of the applied alternating voltage at that instant and also by the relative values of the resistances 51 and 52. However, the instant of transition of the transistor TR502 from a conductive state to a cut-off state, or vice-versa is determined under conditions in which the diode D502 is conducting. The voltage at the junction X is thus determined not only by the magnitude of the applied alternating voltage at that instant and by the values of the resistances 51 and 52, but also by the resistance 53 being effectively in shunt with the resistance 51. Accordingly, at the instant of transition of conduction to the cut-off state, or vice-versa, the voltage at the junction X lies approximately mid-way between the voltage at the terminal A and the voltage at the terminal D. Assuming the voltage at terminal D is +9.3 volts and that the forward voltage drop across the emitter-base junction of the transistor TR501 is 0.6 volts, the voltage at the junction X crosses the zero level each time that the instantaneous magnitude of the applied alternating voltage is −8.7 volts.

In FIG. 6A, the sharp fall in the amplitude of the wave 605 corresponds with the transition of the state of conduction of the transistor TR502 from conduction to cut-off, whereas in FIG. 6B the sharp rise in the amplitude of the wave 605 corresponds with the transition from cut-off to conduction.

The operation of the transistors TR503 and TR504 in the circuit arrangement of FIG. 5 is the same as that of the transistors TR3 and TR4 of the circuit arrangement of FIG. 3 and requires no further explanation.

Figure 7:
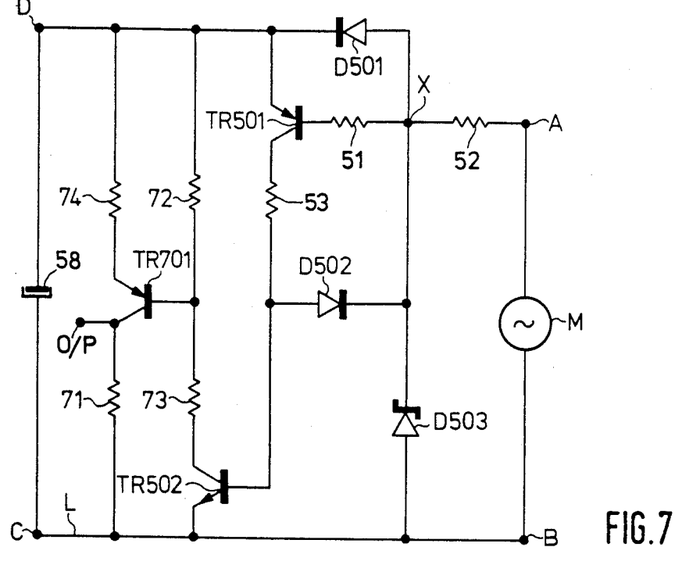
FIG. 7 is a circuit diagram of a still further circuit arrangement in accordance with the invention.

The circuit arrangement of FIG. 7 is a variation of the circuit arrangement of FIG. 5, in which like parts are denoted by like letters and/or numerals.

In the circuit arrangement of FIG. 7, the transistors TR503 and TR504 together with associated circuitry have been replaced by the transistor TR701 having a resistance 71 in its collector circuit across which an output signal is developed and becomes available at the output terminal OP. The base electrode of the transistor TR701 is connected to the junction of a pair of resistances 72 and 73 which are serially connected between the terminal D and the collector electrode of the transistor TR502, the emitter electrode of which is connected to the line L. Also, in FIG. 7 the end of the resistance 53 remote from the base electrode of the transistor TR502 is connected to the collector electrode of the transistor TR501 instead of being connected directly to the terminal D, as in FIG. 5.

The operation of the circuit arrangement of FIG. 7 is fundamentally similar to that of the circuit arrangement of FIG. 5. However, with the circuit arrangement of FIG. 7 the transistors TR501 and TR502, which respectively function as voltage comparators, are so interconnected with each other as to function in combination as a logic means. A consequence of this is that whenever the transistor TR501 is cut-off, the transistor TR502 is also cut-off.

In this way, during positive half-cycles of the applied alternating voltage, so long as the voltage at the junction X is positive with respect to the potential of terminal D less the forward voltage drop across the emitter-base junction of the transistor TR501 (i.e. positive with respect to 8.7 volts) both transistors TR501 and TR502 are cut-off and since the collector voltage of the transistor TR502 is "high", the transistor TR701 is likewise cut-off so that the voltage at the terminal OP in the collector circuit is "low".

Towards the end of each positive half-cycle of the applied alternating voltage, the transistor TR501 is turned on as soon as the voltage at the junction X falls below approximately 8.7 volts. Conduction of the emitter-collector path of the transistor TR501 provides base-emitter current flow turning on the transistor TR502 also. The consequent drop in the collector voltage of the transistor TR502 causes the transistor TR701 to conduct and for a "high" voltage to be produced at the output terminal OP. However, during the early portion of each negative half-cycle of the applied alternating voltage, the base-emitter path of the transistor TR502 is made non-conductive when the voltage at the junction X falls below zero (i.e. when the instantaneous magnitude of the applied alternating voltage at the terminal A is approximately −8.7 volts) so cutting-off the transistor TR502 and also the transistor TR701, making the voltage at the output terminal OP "low" once more. The transistor TR501 remains turned on until the initial portion of the following positive half-cycle of the applied voltage when the voltage at the junction X becomes more positive than the voltage of the terminal D once more. However, this has no effect upon the output voltage at the terminal OP since the transistor TR502 is turned off.

The circuit arrangement of FIG. 5, likewise that of FIG. 7, is suitable for generating gating pulses for triggering a solid state switching device such as a triac incorporated in an electrical appliance, for example. With the circuit arrangement of FIG. 5, such gating pulses are available at the junction of the resistances 56 and 57. With the circuit arrangement of FIG. 7, such gating pulses are available at the output terminal OP.

In considering the circuit arrangement of FIG. 5 with reference to the waveforms shown in FIG. 6A and FIG. 6B, it is apparent that in both figures the leading edge of the pulse formed by the waveform 606 corresponds with detection by the voltage comparator transistor TR501 of the crossing by the applied alternating voltage 601 of a given threshold level above zero, whereas the trailing edge of that pulse in each case corresponds with detection by the voltage comparator transistor TR502 of a given threshold level below zero.

With the circuit arrangement of FIG. 5, the resistances 51, 52 and 53 are so proportioned relative to each other that the threshold levels respectively above and below zero are equidistant from the reference level zero so that the mid-point of the pulse formed by the waveform 606 corresponds with the instant that the applied alternating voltage 601 crosses the reference level zero, both in FIG. 6A and in FIG. 6B.

It will be appreciated that the upper threshold level, and accordingly the timing of the leading edge of the pulse formed by the waveform 606, is determined principally by the zener voltage of the diode D503 whereas the lower threshold level, and accordingly the timing of the trailing edge of the pulse formed by the waveform 606 is determined not only by the zener voltage of the diode D503, but also by the ratio of the resistance value of the resistance 52 to the resistance value of the resistances 51 and 53 in combination. In other words, the zener voltage of the diode D503 and the resistance values of the resistances 51, 52 and 53 are the principal determinants of the timing of the leading and trailing edges of the pulses generated by the circuit.

With the circuit arrangement of FIG. 5, which has a d.c. supply voltage of 9.4 volts across the terminals D and C determining the upper and lower threshold levels, a wide spread in the detection characteristics of the transistors TR501 and TR502 functioning as voltage comparators results in a relatively small percentage change in the threshold levels. For example, a hypothetical error of +0.3 volts in either of the voltage comparators associated with the transistors TR501 and TR502 produces a resultant error of just over 3% in detection of the threshold level. Such a hypothetical error of +0.3 volts exceeds the maximum error likely to be encountered in practice even without selection or matching of the transistors, taking into account spreads in manufacture and variation in the detection characteristics of the transistors over the anticipated temperature range in operation. The resultant error of approximately 3% may be regarded as exceptionally low in comparison with the spreads in detection levels found with known "zero-crossing detector" circuits.

In the description of the invention so far, in the said electrical path extending between the applied alternating voltage and the dc supply voltage which includes the series combination of two resistances, both of those resistances have a fixed resistance value. However, in utilizing integrated circuit techniques, it is a common practice to employ a network of circuit elements in lieu of a fixed resistance. Typically, such a network may exhibit a non-linear voltage versus current characteristic which may be used to advantage. In accordance with a further aspect of the present invention, one of said resistances of the said series combination has a non-linear voltage versus current characteristic and may be composed of a network of circuit elements.

Figure 8:
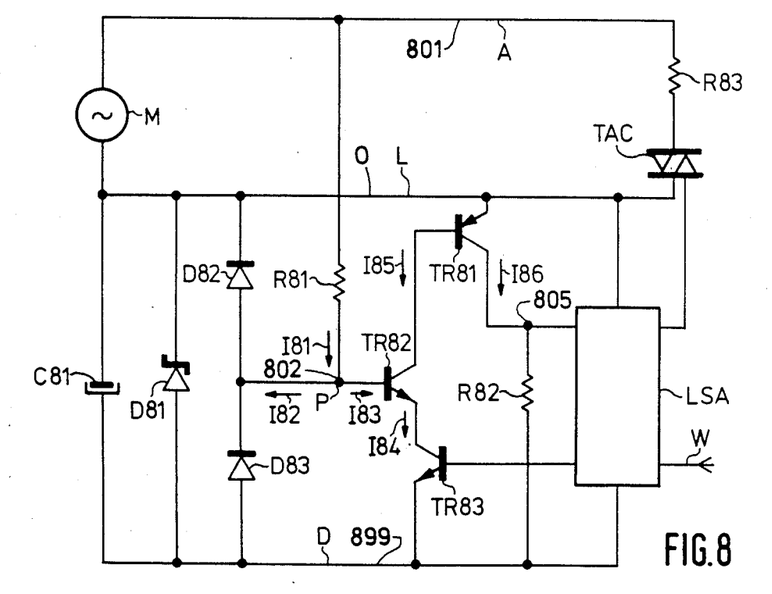
FIG. 8 shows a circuit diagram of the invention in which one of the resistances of the series combination is composed of a network of circuit elements.

FIG. 8 is a circuit diagram of a further circuit arrangement in accordance with the present invention in which one of the resistances of the said series combination is composed of a network of circuit elements having a non-linear voltage versus current characteristic. FIG. 9 shows waveforms related to the operation of the circuit arrangement of FIG. 8.

In the circuit arrangement of FIG. 8, the line L is at a fixed reference level of zero volts and an alternating voltage source M is connected between the line L and the alternating voltage supply line A so that an alternating voltage is applied across the series combination of a load R83 and the triac TAC. A capacitance C81 is connected between the line L and a dc supply line D. The capacitance C81 together with the rectifier diodes D82, D83 and the zener diode D81 provide a direct current supply source whereby the voltage of the supply line D has a fixed magnitude relative to the line L.

For detecting the crossings of the applied alternating voltage of two separate threshold levels respectively above and below zero in accordance with the invention, there is provided the combination of the transistors TR81, TR82 and TR83 which together with the resistances R81 and R82 and the logic and sense amplifier LSA supply firing pulses to the triac TAC in a controlled manner according to a sensing signal supplied to the logic and sense amplifier LSA in a manner which forms no part of the present invention. In one mode of operation the transistors TR81, TR82 and TR83 in combination form the said first voltage comparator and in another mode of operation the transistors TR81, TR82 and TR83 in combination also constitute the said second voltage comparator, a combined logic output being produced across the resistance R82 which is applied to the firing electrode of the triac TAC via the logic and sense amplifier LSA. A fixed dc bias voltage is supplied to the base electrode of the transistor TR83 from the logic and sense amplifier unit LSA. The level of this bias voltage determines the resistance presented by the base-emitter path of the transistor TR82 in combination with the collector-emitter path of the transistor TR83 between the point P and the negative dc supply line D of the circuit arrangement of FIG. 8.

In accordance with the invention, an electrical path extends between the alternating current supply line A and the direct current supply line D which includes the series combination of the resistance R81 and a network formed by the serial arrangement of the base-emitter path of the transistor TR82 and the collector-emitter path of the transistor TR83. The serial arrangement of the base-emitter path of the transistor TR82 with the collector-emitter path of the transistor TR83 is shunted by the combination of the diodes D82, D83 and D81 with the capacitance C81. The network thus formed exhibits a non-linear voltage verses current characteristic. However, the effective resistance present between the point P and the supply line D, i.e. the resistance present between the base electrode of the transistor TR82 and the line D is critical to the respective threshold levels at which switching occurs within the combination of the transistors TR81, TR82 and TR83 as the dual function of the said first voltage comparator and the said second voltage comparator is performed by the combination.

Figure 9A:
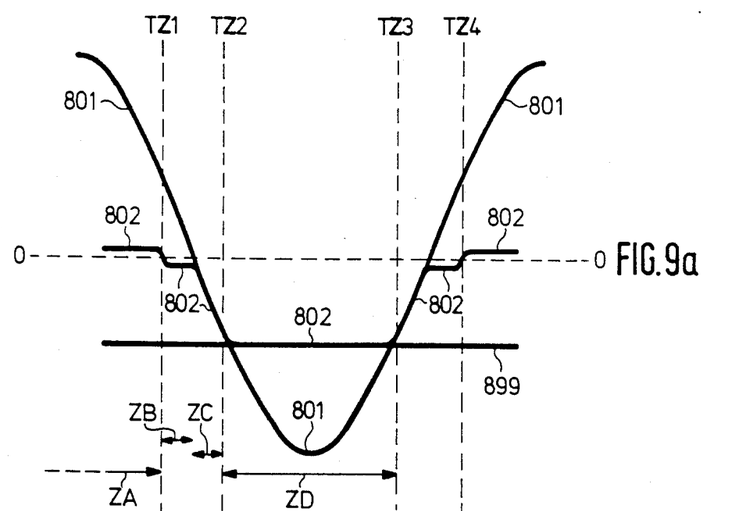
FIGS. 9a–9e show wave forms related to the operation of the circuit arrangement of FIG. 8.
Figure 9B:
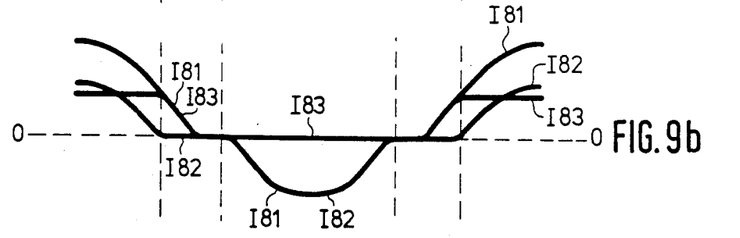
Figures 9C, 9D:
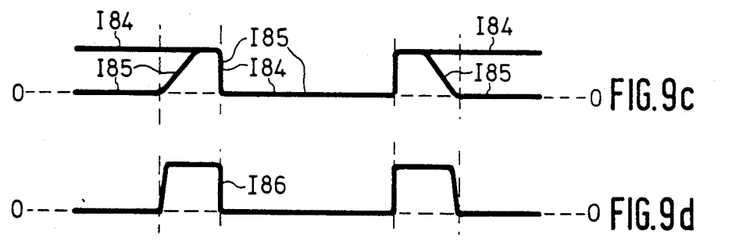
Figure 9E:
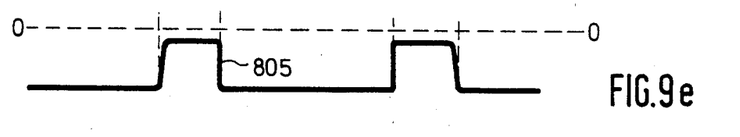

Voltage waveforms present at various parts of the circuit arrangement of FIG. 8, under typical operating conditions, are shown in FIG. 9(a) and FIG. 9(e). Current waveforms present in various current paths forming part of the circuit arrangement or FIG. 8, under typical operating conditions, are shown in FIGS. 9(b), (c) and (d). The waveforms depicted in FIG. 9 are taken over a full cycle of the applied alternating voltage and are shown in correct time relationship to each other. For convenience, the numerals or letters respectively denoting a particular waveform in FIGS. 9(a) to 9(e) are, in each case, also used to denote a part of the circuit arrangement of FIG. 8 or a current path forming a part of the circuit arrangement of FIG. 8 where the denoted voltage or current is present. Time periods are denoted as ZA, ZB etc., and instants of time are denoted as TZ1, TZ2 etc.

Operation of the circuit arrangement of FIG. 8 will be described in association with the waveforms of FIG. 9. In FIG. 9, the applied alternating voltage is denoted by the numeral 801, the fixed reference level of the line L is denoted by 0, the voltage level of the dc supply line D is denoted by the dotted line 899. The voltage present at the point P, i.e. at the junction of the resistance R81 and the network formed by the serial arrangement of the base-emitter path of the transistor TR82 with the collector-emitter path of the transistor TR83, is denoted by the numeral 802.

With the circuit arrangement of FIG. 8, the switching instants of the said first voltage comparator may be said to occur at the time instants TZ2 and TZ3. At the time instant TZ2, the transistor TR83 changes from the conductive to the non-conductive state as the voltage 802 at the point P falls to the voltage level 899 of the dc supply line D. At the time instant TZ3 the transistor TR83 is rendered conductive once more as the voltage 802 rises once more above the voltage level 899. The transistor TR81 is likewise non-conductive between the instants TZ2 and TZ3.

Also, the switching instants of the said second voltage comparator may be said to occur at the time instants TZ1 and TZ4. The transistor TR81 is rendered conducting when the voltage 802 at the point P falls below the reference level zero at the time instant TZ1 when the serial combination of the base-emitter path of the transistor TR82 and the emitter-collector path of the transistor TR83 is not able to sustain the saturation level of current flow so that some of the base current of the transistor TR82 starts to flow to its collector turning on the transistor TR81. The voltage level at point P remains below the reference level 0 until the instant TZ4 when the process is reversed with the voltage at the point P exceeding zero so that the collector-emitter path of the transistor TR83 becomes saturated once more.

Considering now the operation of the circuit arrangement of FIG. 8 in somewhat more detail. During the time period ZA (i.e. during a portion of each positive half cycle of the applied alternating voltage 801 as shown by FIGS. 9(a)), current flows from the alternating voltage supply line A via the resistance R81 and the diode D82 to the common supply line L which is at the fixed reference voltage level 0. During this time period ZA, the transistor TR82 is completely saturated and the collector electrode and the emitter electrode of the transistor TR82 are at almost the same potential, which is too high relative to the said fixed reference level 0 for the transistor TR81 to conduct. Accordingly, during the time period ZA, the transistor TR81 is non-conducting and its collector current I86 is zero as shown in FIG. 9(d). As the applied alternating voltage 801 falls relative to the voltage 899 of the dc supply line D, the collector voltage and emitter voltage of the transistor TR82 likewise fall and an instant TZ1 is reached at which, even though the transistor TR82 is still saturated, some of the base current of the transistor TR82 starts to flow via its collector, thereby turning on the transistor TR81. The instant TZ1 denotes the commencement of the time period ZB during which the base current I85 of the transistor TR81 is increasing and the base current of the transistor TR82 is falling. The instant TZ1 is determined by the voltage 802 (the voltage at point P) relative to the reference level zero of the supply line L whereas the magnitude of the voltage 802 is determined by the voltage division ratio between the resistance R81 and the effective resistance of the serial combination of the base-emitter path of the transistor TR82 with the collector-emitter path of the transistor TR83 immediately prior to the instant TZ1.

With the fall in the base current I83 of the transistor TR82 during the time period ZB, the collector current I84 of the transistor TR83 is taken from the base of the transistor TR81 via the collector of the transistor TR82. During the time period ZC the emitter voltage of the transistor TR82 goes more negative following the negative going voltage at point P until the transistor TR83 begins to saturate. When the transistor TR83 is completely saturated, its collector voltage is at almost the same potential as that of the supply rail D (i.e. voltage 899) so that as soon as the voltage at point P falls to a threshold level one $V_{be}$ below the voltage 899, the transistor is immediately cut-off. This occurs at the instant TZ2 and the transistor TR81 is, of course, simultaneously cut-off and the transistor TR83 also ceases to conduct.

During the subsequent portion of the negative half-cycle of the applied voltage 801, the voltage 802 present at point P remains below the threshold level one $V_{be}$ above the voltage 899 until the applied voltage 801 goes less negative once more during the later portion of the negative half cycle causing the voltage at point P to rise above the threshold level 899 once more so that the process is reversed with the transistor TR82, TR83 and TR81 becoming conductive once more at the time instant TZ3 and with the transistor TR81 being subsequently cut-off at the time instant TZ4 by the saturation of the transistor TR82.

The combined function of the three transistors TR81, TR82 and TR83 results in the flow of the collector current in the transistor TR81 and in the resistance R82, as shown by the waveform I86 in FIG. 9(d) so that the voltage 805 is developed across the resistance R82. This voltage is processed by the amplifier LSA and applied to the triac TAC. The similarity of the waveform 805 of FIG. 9(e) to the waveform of FIG. 2(d) will be recognised.

We claim:

1. A circuit arrangement for detecting the crossings by an applied alternating voltage of two separate threshold levels respectively above and below a fixed reference voltage level comprising:

a direct current source supplying a dc supply voltage of fixed magnitude relative to the reference voltage, an electrical path extending between the applied alternating voltage and the dc supply voltage which includes a series combination of two resistances, a first voltage comparator having two possible logic output states and connected to compare the voltage at a junction of the two resistances with the dc supply voltage so that the logic output state of the first voltage comparator at any instant is determined by the voltage at the junction relative to the dc supply voltage, a second voltage comparator having two possible logic output states and connected to compare the voltage at the junction of the two resistances with the reference voltage so that the logic output state of the second voltage comparator at any instant is determined by the voltage at the junction relative to the reference voltage, and logic means in which the logic output state of the first comparator is combined logically with the logic output state of the second comparator to produce a pulse spanning each instant of cross-over by the applied alternating voltage of the fixed reference voltage, said pulse having a leading edge and a trailing edge which respectively correspond with the instants of crossing by the applied alternating voltage of the two separate threshold levels and whereby one threshold level is determined by the magnitude of the dc voltage and the other threshold level is determined by the ratio of the resistance values of the two resistances and the dc supply voltage.

2. A circuit arrangement as claimed in claim 1 wherein said resistances are so proportioned with respect to each other that a mid-point of each said pulse spanning each instant of cross-over substantially coincides with the instant of cross-over by the applied alternating voltage of the fixed reference voltage.

3. A circuit arrangement as claimed in claim 2 in which the said fixed reference voltage is zero voltage.

4. A circuit arrangement as claimed in claim 1 wherein said first voltage comparator includes a first transistor having a base/emitter path connected between said dc supply voltage and one end of said series combination thereby forming a part of said electrical path, and said second voltage comparator includes a second transistor of opposite conductivity type to the first transistor, the base-emitter path of which is connected via an isolation means between the reference voltage and said junction of the two resistances.

5. A circuit arrangement as claimed in claim 1 wherein one of said resistances has a non-linear voltage versus current characteristic.

6. A circuit arrangement as claimed in claim 5 wherein said resistance having a non-linear voltage versus current characteristic comprises a network of circuit elements.

7. A circuit arrangement as claimed in claim 1 wherein the dc supply voltage is derived by rectification of the voltage at said junction of the two resistances.

8. A circuit arrangement as claimed in claim 1 wherein said fixed reference voltage is zero voltage.

9. A circuit arrangement as claimed in claim 2 wherein said first voltage comparator includes a first transistor having a base/emitter path connected between the dc supply voltage and one end of said series combination thereby forming a part of said electrical path, and said second voltage comparator includes a second transistor of opposite conductivity type to the first transistor, the base-emitter path of which is connected via an isolation means between the reference voltage and said junction of the two resistances.

10. A circuit arrangement as claimed in claim 2 wherein one of said resistances has a non-linear voltage versus current characteristic.

11. A circuit arrangement as claimed in claim 4, wherein one of said resistances has a non-linear voltage versus current characteristic.

12. A circuit arrangement as claimed in claim 4, further comprising a diode coupled to said junction of the two resistances whereby said DC supply voltage is derived by rectification of the voltage at said junction.

13. A circuit arrangement as claimed in claim 5, further comprising a diode coupled to said junction of the two resistances whereby said DC supply voltage is derived by rectification of the voltage at said junction.

* * * * *